(12) United States Patent
Zhao et al.

(10) Patent No.: US 11,414,774 B2
(45) Date of Patent: Aug. 16, 2022

(54) MANUFACTURING METHOD OF DISPLAY PANEL

(71) Applicant: TCL CHINA STAR OPTOELECTRONICS TECHNOLOGY CO., LTD., Shenzhen (CN)

(72) Inventors: Jinyang Zhao, Shenzhen (CN); Miao Zhou, Shenzhen (CN)

( * ) Notice: Subject to any disclaimer, the term of this patent is extended or adjusted under 35 U.S.C. 154(b) by 462 days.

(21) Appl. No.: 16/619,485

(22) PCT Filed: Nov. 12, 2019

(86) PCT No.: PCT/CN2019/117398
§ 371 (c)(1),
(2) Date: Dec. 5, 2019

(87) PCT Pub. No.: WO2021/042531
PCT Pub. Date: Mar. 11, 2021

(65) Prior Publication Data
US 2021/0332493 A1 Oct. 28, 2021

(30) Foreign Application Priority Data

Sep. 4, 2019 (CN) .................. 201910831552.X

(51) Int. Cl.
*H05K 1/09* (2006.01)
*H05K 3/06* (2006.01)
(Continued)

(52) U.S. Cl.
CPC .............. *C25D 15/00* (2013.01); *H05K 3/24* (2013.01); *H05K 3/285* (2013.01); *H05K 1/0274* (2013.01); *H05K 3/06* (2013.01); *H05K 2203/0117* (2013.01); *H05K 2203/0776* (2013.01); *H05K 2203/105* (2013.01); *H05K 2203/1105* (2013.01)

(58) Field of Classification Search
CPC .......... H05K 1/09; H05K 1/0274; H05K 3/06; H05K 3/24; H05K 3/285; C25D 15/00; H01L 31/00
USPC .......... 204/477; 428/690; 136/244, 251, 263
See application file for complete search history.

(56) References Cited

U.S. PATENT DOCUMENTS

| 9,971,224 B2* | 5/2018 | Toko ..................... G02F 1/163 |
| 2005/0236037 A1* | 10/2005 | Ahn ..................... H01G 9/2081 |
| | | 136/251 |
| 2007/0082227 A1* | 4/2007 | Kobayashi ........... H05B 33/145 |
| | | 428/690 |

FOREIGN PATENT DOCUMENTS

| CN | 1538787 A | 10/2004 |
| CN | 1871378 A | 11/2006 |

(Continued)

*Primary Examiner* — Xiaoliang Chen

(57) ABSTRACT

The present disclosure provides a manufacturing method of a display panel which includes forming a pattern of a first electrode layer on a first substrate; coating a nano particle solution on the pattern of the first electrode layer and the first substrate; providing a second substrate formed with a pattern of a second electrode layer, wherein the pattern of the first electrode layer corresponds to the pattern of the second electrode layer; and connecting the pattern of the first electrode layer and the pattern of the second electrode layer to a power supply to perform a patterning treatment on the nano particle solution to make the nano particle solution form a pattern of a nano particle layer.

10 Claims, 4 Drawing Sheets

(51) Int. Cl.
*H05K 3/24* (2006.01)
*C25D 15/00* (2006.01)
*H01L 31/00* (2006.01)
*H05K 3/28* (2006.01)
*H05K 1/02* (2006.01)

(56) References Cited

FOREIGN PATENT DOCUMENTS

| | | |
|---|---|---|
| CN | 102431964 A | 5/2012 |
| CN | 104808384 A | 7/2015 |
| CN | 104979484 A | 10/2015 |
| CN | 106374056 A | 2/2017 |
| CN | 106479503 A | 3/2017 |
| CN | 108962965 A | 12/2018 |
| CN | 109658820 A | 4/2019 |
| KR | 20080062907 A | 7/2008 |
| KR | 20160014207 A | 2/2016 |

\* cited by examiner

MANUFACTURING METHOD OF DISPLAY PANEL

FIELD OF INVENTION

The present disclosure relates to the field of display technologies, and more particularly, to a manufacturing method of a display panel.

BACKGROUND OF INVENTION

Nano materials are structural units having sizes ranging from 1 nm to 100 nm. Due to having volume effect, surface effect, quantum size effect, and macroscopic quantum tunneling effect, nano materials have unique characteristics of melting point, magnetism, optics, thermal conductivity, and electrical conductivity, thereby having important application value in a lot of fields.

Quantum dots are nano materials having high luminous efficiency and narrow emission peak, and are widely used in products of backlights. Current patterning techniques of quantum dots are mainly achieved by inkjet printing and photolithography, which have high manufacturing cost and complex preparing processes for pixels that restrict large-scale promotion thereof.

Therefore, it is necessary to provide a new type of patterning technique for quantum dots to solve the above problem.

SUMMARY OF INVENTION

The present disclosure provides a manufacturing method of a display panel to solve the technical problem of complex preparing processes of current quantum dot display panels.

To solve the above problem, the present disclosure provides following technical solutions:

an embodiment of the present disclosure provides a manufacturing method of a display panel which comprises:

forming a pattern of a first electrode layer on a first substrate;

coating a nano particle solution on the pattern of the first electrode layer and the first substrate;

providing a second substrate formed with a pattern of a second electrode layer, wherein the second substrate is disposed opposite to the first substrate, and the pattern of the first electrode layer corresponds to the pattern of the second electrode layer;

connecting the pattern of the first electrode layer and the pattern of the second electrode layer to a power supply to perform a patterning treatment on the nano particle solution to make the nano particle solution form a pattern of a nano particle layer; and removing the second substrate.

In the manufacturing method of the present disclosure, the step of forming the pattern of the first electrode layer on the first substrate comprises:

providing the first substrate;

coating a first metal film layer on the first substrate; and patterning the first metal film layer by a first mask process to make the first metal film layer form the pattern of the first electrode layer including at least two first electrode units.

In the manufacturing method of the present disclosure, before coating a nano particle solution on the pattern of the first electrode layer and the first substrate, the method further comprises:

forming a continuous retaining wall on the first substrate;

wherein, the retaining wall is disposed on an edge region of the first substrate, and the pattern of the first electrode layer is disposed within the retaining wall.

In the manufacturing method of the present disclosure, the nano particle solution covers the pattern of the first electrode layer and the first substrate, and a thickness of the nano particle solution is less than a thickness of the retaining wall.

In the manufacturing method of the present disclosure, nano particles in the nano particle solution comprise one of quantum dots, holes, or electrons.

In the manufacturing method of the present disclosure, the step of providing the second substrate formed with the pattern of the second electrode layer, and wherein the second substrate is disposed opposite to the first substrate, comprises:

providing the second substrate;

coating a second metal film layer on the second substrate; and patterning the second metal film layer by a second mask process to make the second metal film layer form the pattern of the second electrode layer including at least two second electrode units.

In the manufacturing method of the present disclosure, an orthographic projection of the second electrode units on the first electrode units coincides with the first electrode units.

In the manufacturing method of the present disclosure, the pattern of the nano particle layer comprises at least two nano particle units;

one of the nano particle units corresponds to one of the first electrode units or/and one of the second electrode units; and a pattern of the nano particle units is a same as patterns of the first electrode units and the second electrode units.

In the manufacturing method of the present disclosure, the step of connecting the pattern of the first electrode layer and the pattern of the second electrode layer to the power supply to perform the patterning treatment on the nano particle solution to make the nano particle solution form the pattern of the nano particle layer comprises:

applying an alternating current to the pattern of the first electrode layer and the pattern of the second electrode layer to form an alternating current electric field between the pattern of the first electrode layer and the pattern of the second electrode layer;

the alternating current electric field making the nano particles in the nano particle solution aggregate between the pattern of the first electrode layer and the pattern of the second electrode layer; and removing a solvent from the nano particle solution by a predetermined process to form the pattern of the nano particle layer.

In the manufacturing method of the present disclosure, the step of removing the solvent from the nano particle solution by the predetermined process comprises:

removing the solvent from the nano particle solution by heating or vacuuming; or adding a reactive monomer to the nano particle solution and removing the solvent from the nano particle solution by heating or UV curing.

Beneficial effect: the present disclosure simplifies the patterning processes of quantum dots and improves productivity by forming an alternating current electric field between a pattern of a first electrode layer and a pattern of a second electrode layer and adjusting strength and frequency of the alternating current electric field to make quantum dots in a solution layer having the quantum dots form a predetermined pattern.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
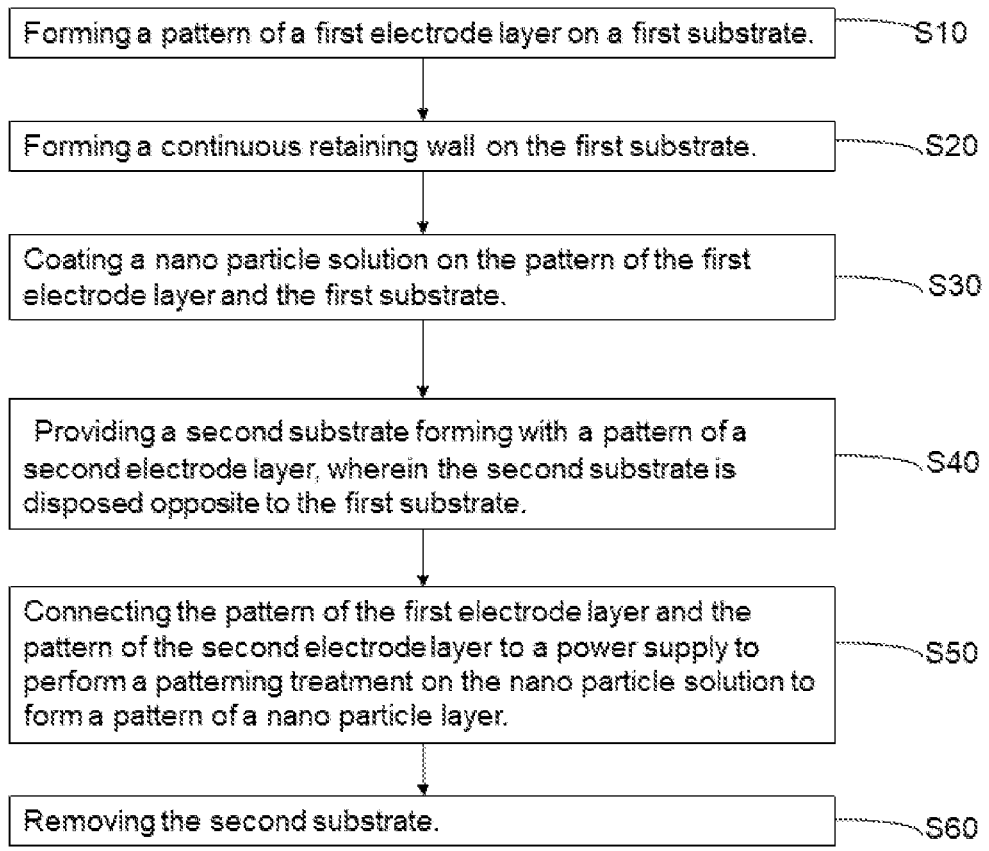
FIG. 1 is a flowchart of a manufacturing method of a display panel according to an embodiment of the present disclosure.

The embodiments of the present disclosure are described in detail hereinafter. Examples of the described embodiments are given in the accompanying drawings, wherein the identical or similar reference numerals constantly denote the identical or similar elements or elements having the identical or similar functions. In the description of the present disclosure, it should be understood that terms such as "upper", "lower", "front", "rear", "left", "right", "inside", "outside", "side", as well as derivative thereof should be construed to refer to the orientation as described or as shown in the drawings under discussion. These relative terms are for convenience of description, do not require that the present disclosure be constructed or operated in a particular orientation, and shall not be construed as causing limitations to the present disclosure.

Current quantum dot patterning techniques mainly comprise inkjet printing and photolithography. Due to the above two techniques having certain restrictions and complex processes, the above two patterning techniques cannot be widely used in industries.

Referring to FIG. 1 and FIG. 2A to FIG. 2G, the manufacturing method of a display panel 100 comprises:

S10: forming a pattern of a first electrode layer 12 on a first substrate 11.

Figure 2A:
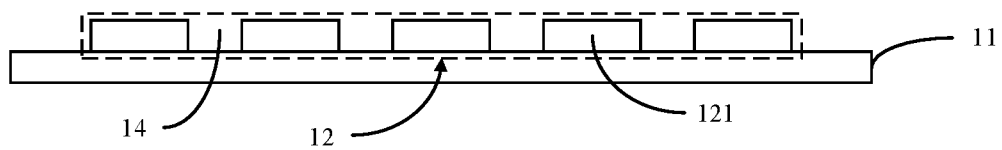
FIG. 2A to FIG. 2G are schematic structural diagrams of the display panel in each step of the manufacturing method of the display panel according to an embodiment of the present disclosure.

Referring to FIG. 2A, the step S10 specifically comprises:

S101: providing the first substrate 11.

A raw material of the first substrate 11 in the step may be a glass substrate, a quartz substrate, a resin substrate, or other hard insulation film materials or soft insulation film materials, which are not specifically limited.

S102: coating a first metal film layer on the first substrate 11.

The first metal film layer can be formed on the first substrate 11 by sputtering in the step. A material of the first metal film layer may comprise indium tin oxide, graphene, or conductive materials constituted by other metals and metal sulfur compounds, which are not specifically limited in the present disclosure.

S103: patterning the first metal film layer by a first mask process to make the first metal film layer form the pattern of the first electrode layer 12 including at least two first electrode units 121.

The step mainly forms the pattern of the first metal film layer by coating a photoresist layer on the first metal film layer, exposing and developing the photoresist layer by a mask to form a predetermined photoresist pattern, performing an etching process on the first metal film layer according to the photoresist pattern to make the first metal film layer form the at least two first electrode units 121, and stripping off the photoresist pattern.

In the embodiment, the etching process can be a wet etching process using an acid solution to pattern a metal layer.

S20: forming a continuous retaining wall 13 on the first substrate 11.

Figure 2B:
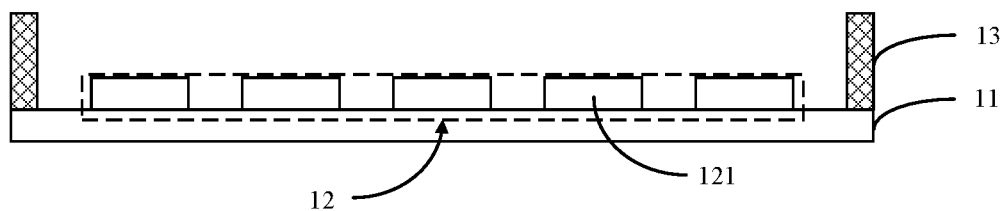
Figure 2C:
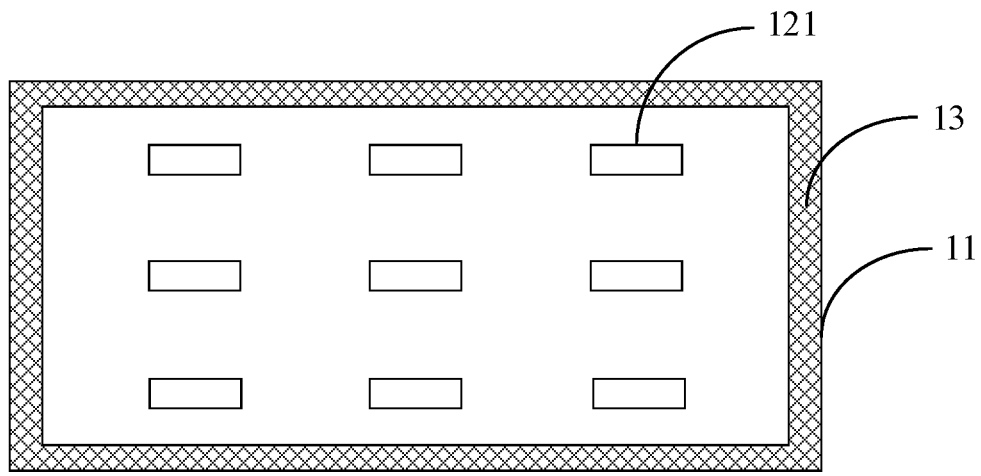

Referring to FIG. 2B and FIG. 2C, FIG. 2C is a top view of FIG. 2B.

In the embodiment, the retaining wall 13 can be disposed on an edge region of the first substrate 11. An edge of the retaining wall 13 may be flush with an edge of the first substrate 11.

The pattern of the first electrode layer 12 is disposed within a ring area formed by the retaining wall 13. The retaining wall 13 and the first substrate 11 form a groove that prevents a subsequent nano particle solution 14 from overflowing.

S30: coating the nano particle solution 14 on the pattern of the first electrode layer 12 and the first substrate 11.

Figure 2D:
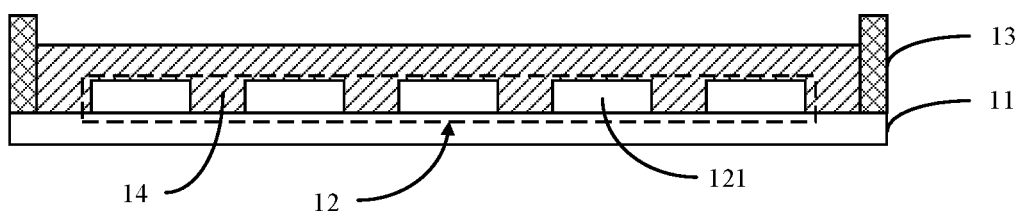

Referring to FIG. 2D, the nano particle solution 14 in the step is a solution having a plurality of nano particles. The nano particles are distributed uniformly in the solvent of the nano particle solution 14.

In the embodiment, the nano particles can comprise quantum dots, holes, electrons, other inorganic nano particles with or without charge, nanoparticles of precious metals, colloidal nanosheets, or colloidal nanorods, which are not specifically limited in the present disclosure.

In the embodiment, the nano particle solution 14 can be a quantum dot solution.

The quantum dot solution comprises quantum dots and a dispersant.

The quantum dots can comprise luminescent cores and inorganic protective shells.

In the embodiment, the luminescent cores may comprise one or more combinations of ZnCdSe2, InP, Cd2SSe, CdSe, Cd2SeTe, and InAs.

In the embodiment, the inorganic protective shells may comprise one or more combinations of CdS, ZnSe, ZnCdS2, ZnS, and ZnO.

The quantum dots also can comprise other highly stable composite quantum dots, such as quantum dots loaded hydrogel structures CdSe—SiO2 and perovskite quantum dots.

The quantum dots also can comprise a quantum dot surface ligand, such as common QD organic ligands (amine/acid/sterol/organophosphorus).

In the embodiment, the dispersant may comprise a colorless transparent organic or inorganic reagent with low boiling point and high volatility.

In the embodiment, the nano particle solution 14 covers the pattern of the first electrode layer 12 and the first substrate 11.

In the embodiment, since the nano particle solution 14 is a solution form, to ensure the nano particle solution 14 retains on the first substrate 11, a thickness of the nano particle solution 14 should be less than a thickness of the retaining wall 13 to prevent the solution from overflowing.

S40: providing a second substrate 21 formed with a pattern of a second electrode layer 22, wherein the second substrate 21 is disposed opposite to the first substrate 11, and the pattern of the first electrode layer 12 corresponds to the pattern of the second electrode layer 22.

Figure 2E:
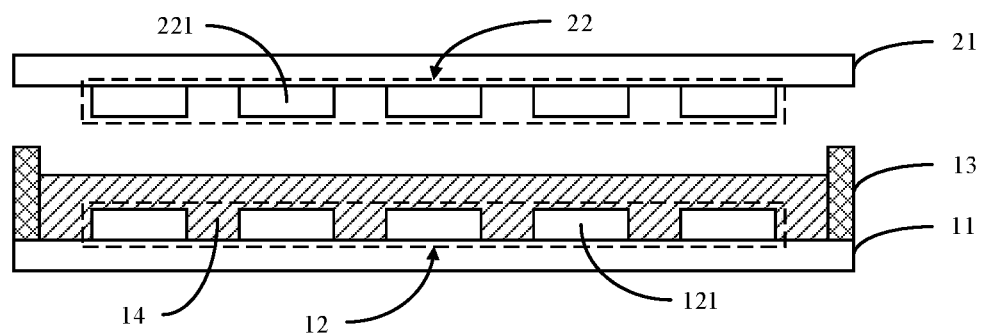

Referring to FIG. 2E, the step S40 specifically comprises:

S401: providing the second substrate 21.

In the embodiment, a material of the second substrate 21 can be the same as the material of the first substrate 11, which will not be iterated herein for the sake of conciseness.

S402: coating a second metal film layer on the second substrate 21.

The second metal film layer can be formed on the second substrate 21 by sputtering in the step. A material of the second metal film layer may comprise indium tin oxide, graphene, or conductive materials constituted by other metals and metal sulfur compounds, which are not specifically limited in the present disclosure.

S403: patterning the second metal film layer by a second mask process to make the second metal film layer form the pattern of the second electrode layer 22 including at least two second electrode units 221.

The step mainly forms the pattern of the second metal film layer by coating a photoresist layer on the second metal film layer, exposing and developing the photoresist layer by a mask to form a predetermined photoresist pattern, performing an etching process on the second metal film layer according to the photoresist pattern to make the second metal film layer form at least two second electrode units 221, and stripping off the photoresist pattern.

S404: disposing the second substrate 21 opposite to the first substrate 11, and making the pattern of the first electrode layer 12 correspond to the pattern of the second electrode layer 22.

Referring to FIG. 2E, the step disposes the first substrate 11 opposite to the second substrate 21 and makes the first electrode units 121 correspond to the second electrode units 221.

In the embodiment, one of the first electrode units 121 corresponds to one of the second electrode units 221.

Figure 2F:
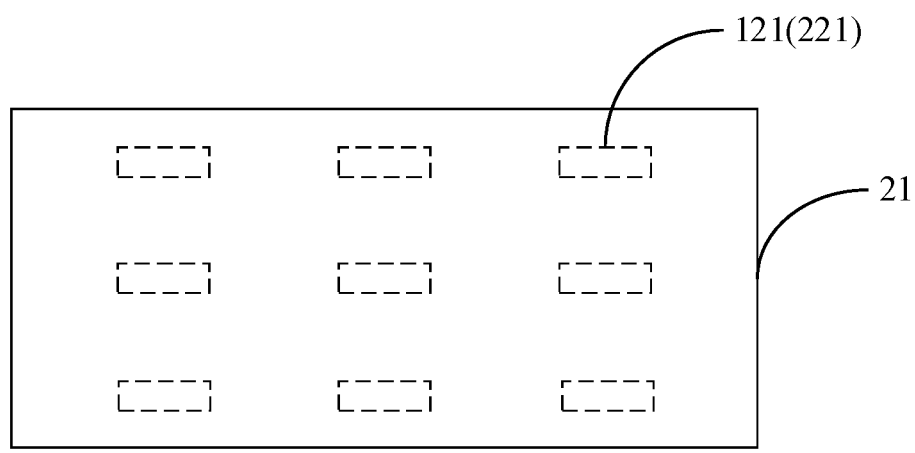

In the embodiment, referring to FIG. 2F, an orthographic projection of the second electrode units 221 on the first electrode units 121 coincides with the first electrode units 121.

In an embodiment of the present disclosure, sizes of the first electrode units 121 and the second electrode units 221 can be the same or different, which is not limited in the present disclosure.

S50: connecting the pattern of the first electrode layer 12 and the pattern of the second electrode layer 22 to a power supply to perform a patterning treatment on the nano particle solution to form a pattern of a nano particle layer 140.

Referring to FIG. 2E, the step S50 specifically comprises:

S501: applying an alternating current to the pattern of the first electrode layer 12 and the pattern of the second electrode layer 22 to form an alternating current electric field between the pattern of the first electrode layer 12 and the pattern of the second electrode layer 22;

S502: the alternating current electric field making the nano particles in the nano particle solution 14 aggregate between the pattern of the first electrode layer 12 and the pattern of the second electrode layer 22; and S503: removing a solvent from the nano particle solution 14 by a predetermined process to form the pattern of the nano particle layer 140.

In the above steps, the embodiment of the present disclosure applies an alternating current to the pattern of the first electrode layer 12 and the pattern of the second electrode layer 22 to form an alternating current electric field between the pattern of the first electrode layer 12 and the pattern of the second electrode layer 22. Dielectric forces and electroosmosis effect generated by the alternating current electric field make the quantum dots aggregate in the middle of the electric field, and the nano particles in the nano particle solution 14 can form a same pattern as the first electrode units 121 and the second electrode units 221 by patterning the first electrode units 121 and the second electrode units 221.

In the embodiment, the pattern of the nano particle layer 140 comprises at least two nano particle units 141. One of the nano particle units 141 corresponds to one of the first electrode units 121 or/and one of the second electrode units 221.

In the embodiment, a pattern of the nano particle units 141 is the same as patterns of the first electrode units 121 and the second electrode units 221.

In the embodiment, the quantum dots are dispersed uniformly in the dispersant, and the quantum dots will aggregate immediately between the electrodes after an alternating current electric field is formed between the pattern of the first electrode layer 12 and the pattern of the second electrode layer 22.

When a strength of electric field is 10 V/μm, an aggregation position and the extent of aggregation of the quantum dots will change as the frequency of the alternating current electric field is changed. For example, when the frequency is less than 6 KHz, the quantum dots will disperse between the whole electrodes and have a shape of long strips; when the frequency ranges from 6 KHz to 100 KHz, the quantum dots will have a shape of short strips or dots; when the frequency is greater than 100 KHz, the quantum dots will not aggregate.

Similarly, when changing the strength of the alternating current electric field, the distribution of the quantum dots will be changed. Therefore, in actual operation, the strength and frequency of the alternating current electric field need to be adjusted to modulate aggregation states of the quantum dots.

Therefore, the patterning treatment on the quantum dots of the present disclosure needs to synchronously adjust patterning designs of the first electrode units 121 and the second electrode units 221 and the strength and frequency of the alternating current electric field between the pattern of the first electrode layer 12 and the pattern of the second electrode layer 22 to form a predetermined pattern.

Figure 2G:
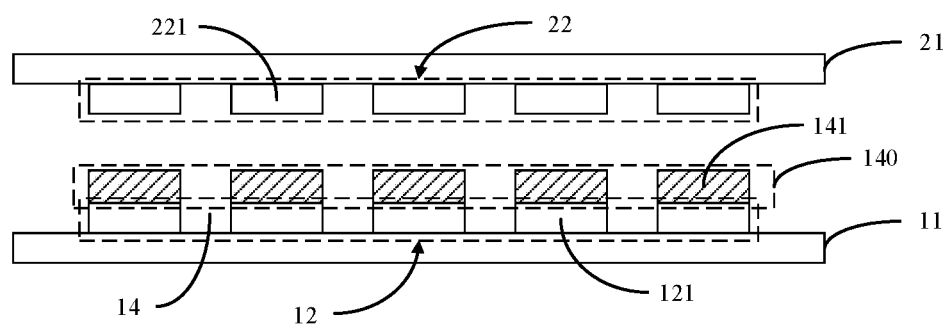

Referring to FIG. 2G, since the nano particles of the present disclosure are dispersed uniformly in corresponding solvents, to ensure patterning of the nano particles, the solvents of the nano particle solution 14 needs to be removed.

In the step S503, the predetermined process of the present disclosure can comprise:

removing the solvent from the nano particle solution by heating or vacuuming; or adding a reactive monomer to the nano particle solution and removing the solvent from the nano particle solution by heating or UV curing.

In the embodiment, because the alternating current electric field generates dielectric forces, the nano particles will be subjected to effect of the dielectric forces even if they are uncharged particles.

S60: removing the second substrate 21.

Referring to FIG. 2G, the second substrate 21 and the pattern of the second electrode layer 22 on the second substrate 21 are tools for forming the alternating current electric field and are not needed in subsequent structures, so they can be removed.

The retaining wall 13 is mainly used for preventing the nano particle solution 14 from overflowing, so the retaining wall 13 can also be removed after manufacturing the pattern of the nano particle layer 140.

The present disclosure provides a manufacturing method of a display panel which comprises forming a pattern of a first electrode layer on a first substrate; coating a nano particle solution on the pattern of the first electrode layer and the first substrate; providing a second substrate formed with a pattern of a second electrode layer, wherein the second substrate is disposed opposite to the first substrate, and the pattern of the first electrode layer corresponds to the pattern of the second electrode layer; and connecting the pattern of the first electrode layer and the pattern of the second electrode layer to a power supply to perform a patterning treatment on the nano particle solution to make the nano particle solution form a pattern of a nano particle layer. The present disclosure simplifies the patterning processes of quantum dots and improves productivity by forming an alternating current electric field between a pattern of a first electrode layer and a pattern of a second electrode layer and adjusting strength and frequency of the alternating current electric field to make quantum dots in a solution layer having the quantum dots form a predetermined pattern.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. A manufacturing method of a display panel, comprising:
    forming a pattern of a first electrode layer on a first substrate;
    forming a continuous retaining wall on the first substrate;
    coating a nano particle solution on the pattern of the first electrode layer and the first substrate;
    providing a second substrate formed with a pattern of a second electrode layer, wherein the second substrate is disposed opposite to the first substrate, and the pattern of the first electrode layer corresponds to the pattern of the second electrode layer;
    connecting the pattern of the first electrode layer and the pattern of the second electrode layer to a power supply to perform a patterning treatment on the nano particle solution to make the nano particle solution form a pattern of a nano particle layer; and
    removing the second substrate.

2. The manufacturing method of the display panel according to claim 1, wherein the step of forming the pattern of the first electrode layer on the first substrate comprises:
    providing the first substrate;
    coating a first metal film layer on the first substrate; and
    patterning the first metal film layer by a first mask process to make the first metal film layer form the pattern of the first electrode layer including at least two first electrode units.

3. The manufacturing method of the display panel according to claim 1, wherein the retaining wall is disposed on an edge region of the first substrate, and the pattern of the first electrode layer is disposed within the retaining wall.

4. The manufacturing method of the display panel according to claim 3, wherein the nano particle solution covers the pattern of the first electrode layer and the first substrate, and a thickness of the nano particle solution is less than a thickness of the retaining wall.

5. The manufacturing method of the display panel according to claim 1, wherein nano particles in the nano particle solution comprise one of quantum dots, holes, or electrons.

6. The manufacturing method of the display panel according to claim 2, wherein the step of providing the second substrate formed with the pattern of the second electrode layer, and wherein the second substrate is disposed opposite to the first substrate, comprises:
    providing the second substrate;
    coating a second metal film layer on the second substrate; and
    patterning the second metal film layer by a second mask process to make the second metal film layer form the pattern of the second electrode layer including at least two second electrode units.

7. The manufacturing method of the display panel according to claim 6, wherein an orthographic projection of the second electrode units on the first electrode units coincides with the first electrode units.

8. The manufacturing method of the display panel according to claim 1, wherein the pattern of the nano particle layer comprises at least two nano particle units;
    one of the nano particle units corresponds to one of the first electrode units or/and one of the second electrode units; and
    a pattern of the nano particle units is same as patterns of the first electrode units and the second electrode units.

9. The manufacturing method of the display panel according to claim 1, wherein the step of connecting the pattern of the first electrode layer and the pattern of the second electrode layer to the power supply to perform the patterning treatment on the nano particle solution to make the nano particle solution form the pattern of the nano particle layer comprises:
    applying an alternating current to the pattern of the first electrode layer and the pattern of the second electrode layer to form an alternating current electric field between the pattern of the first electrode layer and the pattern of the second electrode layer;
    the alternating current electric field making the nano particles in the nano particle solution aggregate between the pattern of the first electrode layer and the pattern of the second electrode layer; and
    removing a solvent from the nano particle solution by a predetermined process to form the pattern of the nano particle layer.

10. The manufacturing method of the display panel according to claim 9, wherein the step of removing the solvent from the nano particle solution by the predetermined process comprises:
    removing the solvent from the nano particle solution by heating or vacuuming; or
    adding a reactive monomer to the nano particle solution and removing the solvent from the nano particle solution by heating or UV curing.

* * * * *